United States Patent
Lee et al.

(10) Patent No.: US 6,545,938 B2
(45) Date of Patent: Apr. 8, 2003

(54) BUFFERING CIRCUIT IN A SEMICONDUCTOR MEMORY DEVICE

(75) Inventors: Byung Jae Lee, Kyoungki-do (KR); Joon Ho Kim, Kyoungki-do (KR); Young Jun Nam, Seoul (KR); Kwang Rae Cho, Kyoungki-do (KR); Sang Kwon Lee, Seoul (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/886,465

(22) Filed: Jun. 22, 2001

(65) Prior Publication Data
US 2002/0010829 A1 Jan. 24, 2002

(30) Foreign Application Priority Data
Jun. 23, 2000 (KR) .............................. 00-34896

(51) Int. Cl.[7] ................................. G11C 8/00
(52) U.S. Cl. .................. 365/230.08; 365/222
(58) Field of Search ............... 365/189.05, 191, 365/222, 230.08, 233, 194

(56) References Cited

U.S. PATENT DOCUMENTS

| | | | | |
|---|---|---|---|---|
| 5,912,858 A | * | 6/1999 | Tomita et al. | 365/189.07 |
| 6,097,781 A | * | 8/2000 | Wright et al. | 377/26 |
| 6,141,279 A | * | 10/2000 | Hur et al. | 365/222 |
| 6,292,420 B1 | * | 9/2001 | Kim et al. | 365/185.05 |

* cited by examiner

Primary Examiner—Richard Elms
Assistant Examiner—VanThu Nguyen
(74) Attorney, Agent, or Firm—Pillsbury Winthrop LLP

(57) ABSTRACT

A buffering circuit of a semiconductor memory device is provided with a plurality of buffers divided into groups, comprising: a first controller for generating a first enable signal in response to a refresh signal and a clock enable signal; a second controller for generating a second enable signal in response to an auto-refresh signal and the first enable signal; a first buffer block including at least one of signal input buffers controlled by the first enable signal; and a second buffer block including at least one of signal input buffers controlled by the second enable signal. The groups of the buffers are independently assigned to their corresponding enable signals.

11 Claims, 5 Drawing Sheets

BUFFERING CIRCUIT IN A SEMICONDUCTOR MEMORY DEVICE

FIELD OF THE INVENTION

The present invention relates to a buffering circuit of a semiconductor memory device, and more specifically to a buffering circuit including a plurality of buffers divided into some groups, of which each group is activated independent of the other.

BACKGROUND OF THE INVENTION

In general a number of buffers are employed for converting external signal of TTL (transistor-transistor-logic) level into internal signals of CMOS (complementary metal-oxide-semiconductor) level in a semiconductor memory device. The buffers are disposed at the terminal pads to receive the external signals such as address signals, data signals, and command/control signals.

FIG. 1 shows a construction of the conventional buffering circuit in a semiconductor memory device, in which command buffers and address buffers are simultaneously disabled during a refresh operation for the purpose of reduce current consumption.

Referring to FIG. 1, the buffering circuit includes refresh signal generator 10, buffer controller 20, command buffers group 30, and address buffers group 40.

The refresh signal generator 10 generates refresh signal REF by receiving self-refresh signal SREF and auto-refresh signal AREF and performing a logic operation of these signals through NOR gate NOR1, and inverter IV2. The buffer controller 20 receives clock enable signal CKE from clock enable latch 21, and then generates buffer enable signal E1 through inverter IV1, NOR gate NOR2, and inverter IV3. The inverter IV1 applies an output signal of the latch 21 into the NOR gate NOR2 which also receives the refresh signal REF. An output signal from the NOR gate NOR2 is converted into the buffer enable signal E1 through the inverter IV3. The command buffers group 30 includes chip selection signal buffer CSBUF (hereinafter, referred to as CS buffer), row address strobe signal buffer RASBUF (hereafter, RAS buffer), column address strobe signal buffer CASBUF (hereinafter, CAS buffer), and write enable signal buffer WEBUF (hereinafter, WE buffer). The buffers CSBUF, RASBUF, CASBUF, and WEBUF are activated in response to signal E1a that is logically reversed one of the buffer enable signal E1 through inverter IV4. The address buffers group 40 includes a plurality of address buffers A1~An that are enabled in response to signal E1b that is logically reversed one of the buffer enable signal E1 through inverter IV5. The E1a and E1b will be referred to as the first and second reverse signals, respectively, of the buffer enable signal E1.

The RAS buffer, the CAS buffer, and the WE buffer within the group 30 have the same circuit architecture, except for their corresponding input signals. Hence, the circuit shown in FIG. 2 can correspond to any one of the WEBUF, RASBUF, and CASBUF. Therefore, according to a kine d of buffer input signal VINZ1 can be replaced with one of the write enable signal, the row address strobe signal, or the column address strobe signal. Also, output signal VOUTZ1 can be replaced with one of the write enable signal, the row address strobe signal, or the column address strobe signal. The buffer of FIG. 2 is formed of well-known differential amplifier DA1 which becomes active in response to the first reverse signal E1a and compares the input signal VINZ1 with reference to voltage VREF, and delay circuit DL1, which converts an output signal into an output signal VOUTZ1 after reverse/delay of the output signal of the amplifier DA1.

The address buffers A1~An within the group 40 are constructed in the same constructions with that shown in FIG. 2, exept that the differential amplifier is enabled by the second reverse signal E1b.

FIG. 3 shows a detailed circuit architecture of the CS buffer in the command buffer group 30, including differential amplifier DA2, delay circuits DL2 and DL3, NOR gate NOR3, and inverter IV6. The differential amplifier DA2, is enabled by the first reverse signal E1a, and generates an output signal of comparing input signal VINZ2 (i.e., an external CS signal) with the reference to voltage VREF. The delay circuit DL3 converts the output signal of the differential amplifier DA2 into the first delay signal A, and the delay circuit DL2 converts the buffer enable signal E1 into the second delay signal B. The first and second delay signals A and B are applied to the NOR gate NOR3. An output signal of the NOR gate NOR3 turns into output signal VOUTZ2 (i.e., the chip selection signal) through the inverter IV6.

Referring to FIG. 4, which describes an operation of the buffering circuit shown in FIG. 1, if there is either of the self-refresh signal SREF or the auto-refresh signal AREF which goes up to a high level, the buffer enable signal E1 is set on a high level regardless of the state of the clock enable signal CKE.

In this case, the first and second reverse signals, E1a and E1b, are low levels, causing the differential amplifiers DA1 and DA2 to be disable, and thereby the output signals from the differential amplifiers DA1 and DA2 turn into high levels. Accordingly, the output signal of the differential amplifier DA1 that is assigned to the CAS buffer CASBUF, the RAS buffer RASBUF, or the WE buffer WEBUF is established at a low level after passing through the delay circuit DL1.

Meanwhile, in the CS buffer CSBUF, as the first and second delay signals A and B are applied to the NOR gate NOR3 with low and high levels, respectively, the output signal VOUTZ2 goes up to a high level.

At the time of terminating the refresh mode, t1 in FIG. 4, the buffer enable signal E1 turne to a low level. In the CS buffer CSBUF, the differential amplifier DA2 is enabled in response to the first reverse signal of high level, and then outputs an amplified signal of the input signal VINZ2. The delay signal DL3 inverts and delays the output signal of the differential amplifier DA2, and then makes the first delay signal A.

The first delay signal A is applied to the NOR gate NOR3 together with the second delay signal B that goes to a low level after the delay time. As shown in FIG. 4, after the refresh mode is terminated at the time t1, the second delay signal B falls down to a low level before the CS buffer CSBUF receives the input signal VINZ2. As a result, around t2 after the second delay signal B has been changed to a low level, there is a period that the output signal VOUTZ2 has a short pulse of a low level when the input signal VINZ2 is applied thereto with a low level that makes the first delay signal turne into a high level.

In conttary, at the time t1 finishing the refresh mode, the first reverse signal E1a of a high level enables the RAS buffer RASBUF, the CAS buffer CASBUF, and the WE buffer WEBUF to be conductive. As the output signal VOUTZ1 is still held on a low level because the input signal VINZ1 has not been transferred through the differential amplifier DA1 and the delay circuit DL1 even after the activation of the buffer, it may occur to put the semiconductor memory device into a state of a mode register set (MRS) when the output signal VOUTZ2 figures out at the low pulse as shown in FIG. 4.

Such an abnormal entrance into the MRS mode is not intended to be designed and thereby may cause a malfunction responding to undesirable external signals.

While the undesirable entrance into the MRS is prevented in the self-refresh mode by controlling an enable timing of an internal buffer where the output signal VOUTZ is buffered therethrough to be utilized as an internal command signal in the memory device, the auto-refresh mode can not be free from the malfunction at the time of terminating as aforementioned.

Although there has been various ways to overcome the improper timing with the second delay circuit DL2, it has limits due to large fluctuation of erroneous rates involved in operational factors such as delay timings that are physically affected by supply voltages, temperature, and variations in manufacturing process, rather it reduces operating speed in the environment of high frequency data processing.

Otherwise, additional control logic circuits to regulate the malfunction would make the circuit composition complicate and increase a topological size of the memory chip.

SUMMARY OF THE INVENTION

It is, therefore, an object of the present invention to provide a buffering circuit capable of securing reliable generation of buffered output signals.

It is another object of the invention to provide a buffering circuit preventing a undesirable entrance into a mode register set mode after a refresh operation.

It is still another object of the invention to provide a buffering circuit which controls activation operation of input buffers properly.

In order to attain the above objects, a buffering circuit according to the present invention has a plurality of signal input buffers being divided into a multiplicity of groups. The buffers of each group are controlled by an independent enable signal.

Furthermore, with distinguishing operation modes into a refresh mode and non-refresh mode, as well as the refresh mode into a self-refresh and a auto-refresh, the buffers of each group are independently conductive in accordance with a state of mode.

A buffer controller uses the first refresh signal for discriminating between the refresh mode and the non-refresh mode, and the second refresh signal for designating an alternative one of various refresh modes, and then generates enable signals for the signal input buffers segmented into the multiplicity of groups.

The buffer controller includes the first controller for generating the first control signal to discriminate the refresh mode from and non-refresh mode and to control the signal input buffers, and the second controller for generating the second control signal to operate the signal input buffers.

The signal input buffers of an input buffer group are for example divided into two operable groups by the first and second control signals, respectively.

BRIEF DESCRIPTION OF THE DRAWINGS

The above and other objects, features and advantages of the present invention will become more apparent from the following detailed description when taken in conjunction with the accompanying drawings in which.

DESCRIPTION OF THE PREFERRED EMBODIMENT

It should be understood that the description of the preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 1:
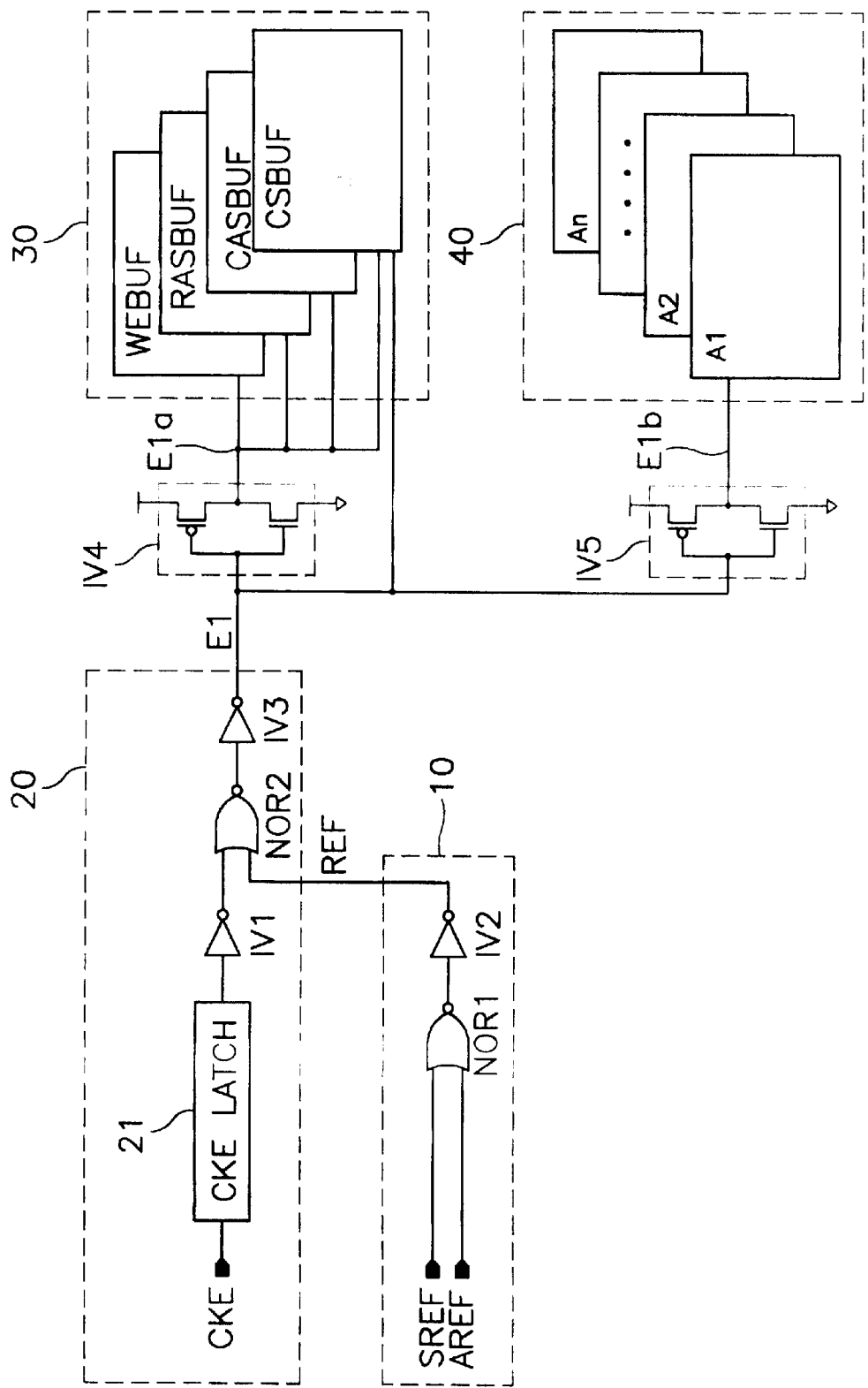
FIG. 1 is a schematic circuit diagram of a conventional buffering circuit.
Figure 5:
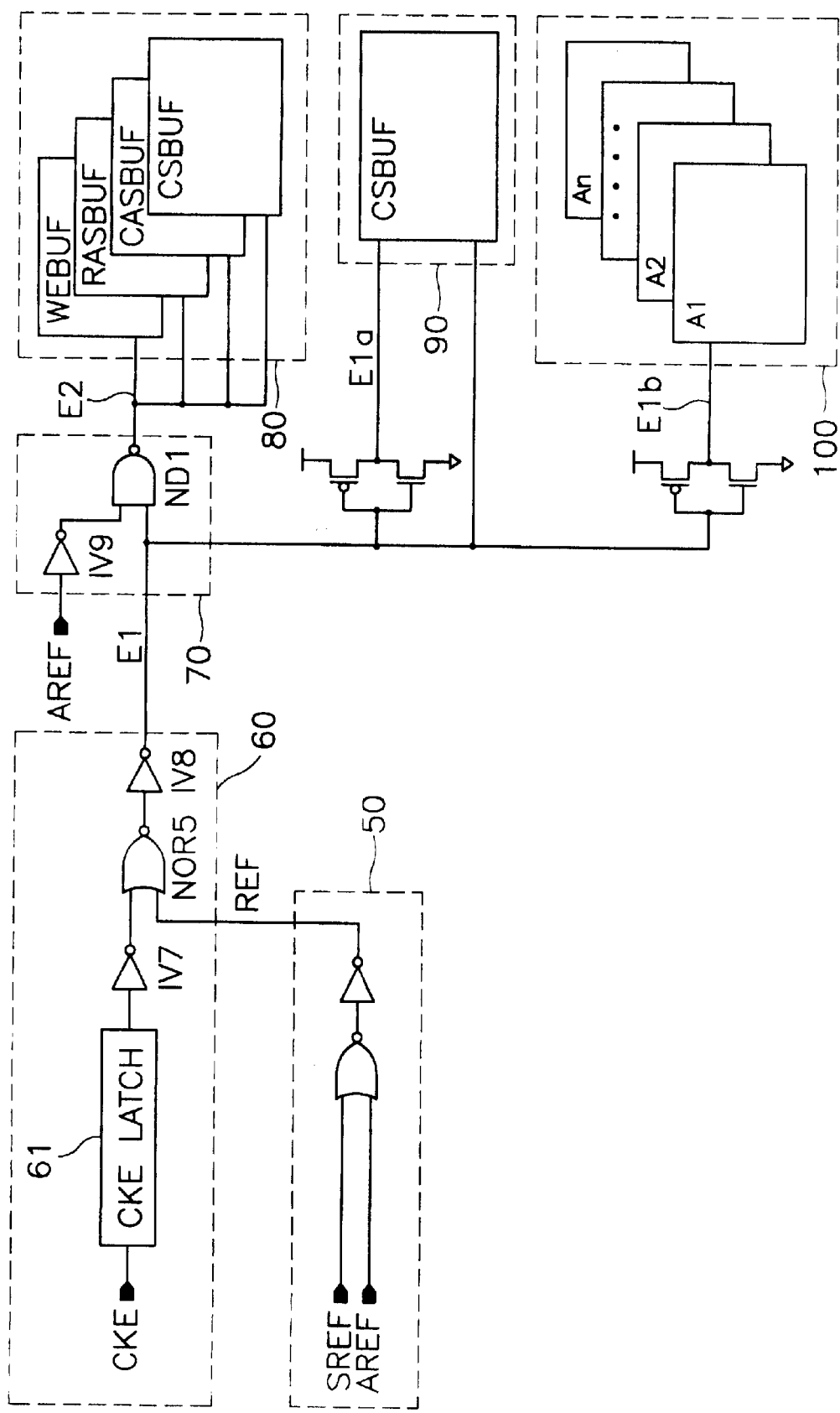
FIG. 5 is a schematic circuit diagram of a buffering circuit according to a preferred embodiment of the invention.

FIG. 5 shows an embodiment of a buffering circuit according to the invention. It is noted that the same circuit components between FIGS. 1 and 5 are assigned to the identical reference numerals. Referring to FIG. 5, the buffering circuit includes refresh signal generator 50, the first buffer controller 60, the second buffer controller 70, the first command buffer block 80, the second command buffer block 90, and address buffer block 100.

The refresh signal generator 50 generates the refresh signal REF by receiving the self-refresh signal SREF and the auto-refresh signal AREF and then performing a logic operation of these signals through a NOR gate NOR1 and inverter IV2. SREF and AREF are command signals to force the memory device to be put into the self-refresh mode and the auto-refresh mode, respectively. Thus, the refresh signal REF optionally selects the refresh or non-refresh modes.

The first buffer controller 60 receives clock enable signal CKE through the clock enable latch 61, and then generates the first buffer enable signal E1 through inverter IV7, NOR gate NOR5, and inverter IV8. The inverter IV7 applies an output signal of the clock enable latch 61 into the NOR gate NOR5 which also receives the refresh signal REF. The output signal from the NOR gate NOR5 is converted into the first buffer enable signal E1 through the inverter IV8.

The first buffer enable signal E1 is applied to the second buffer controller 70. Also, the first buffer enable signal E1 is applied to the second command buffer block 90 and the address buffer block 100 through the inverters IV10 and IV11.

In the second buffer controller 70, the auto-refresh signal AREF is applied to NAND gate ND1, through inverter IV9, together with the first buffer enable signal E1. The NAND gate ND1 generates the second buffer enable signal E2.

The auto-refresh signal AREF optionally selects the auto-refresh of self-refresh modes. The second buffer enable signal E2 from the second buffer controller 70 is applied to the WE buffer WEBUF, the RAS buffer RASBUF, and the CAS buffer CASBUF, which are disposed in the first command buffer block 80, in order to control their activation.

Figure 2:
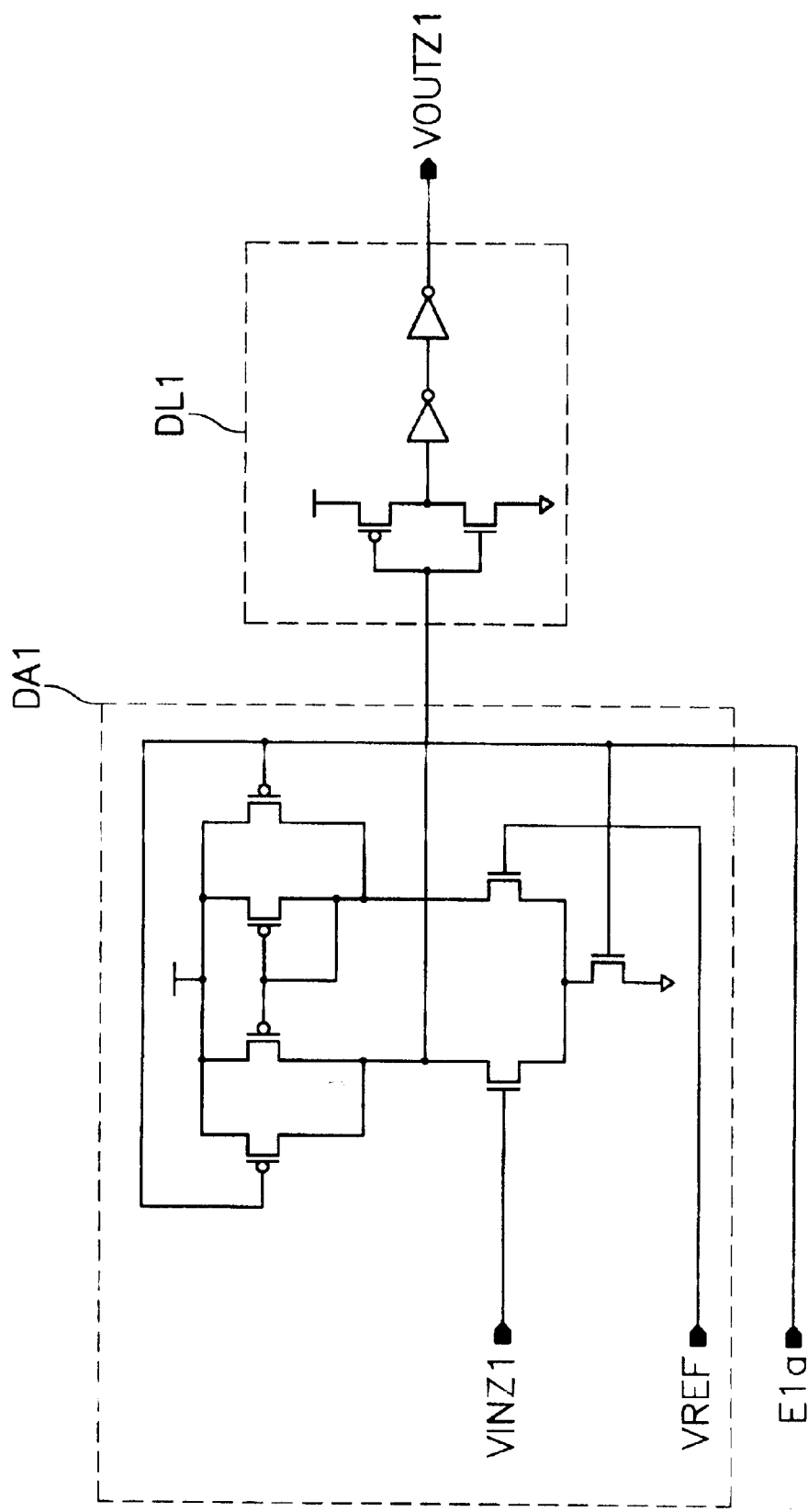
FIG. 2 is a circuit diagram of a row address strobe signal buffer, a column address strobe signal buffer, or a write enable signal buffer all shown in FIG. 1.

The circuit constructions of the buffers WEBUF, RASBUF, and CASBUF are the same as those shown in FIG. 2.

Figure 3:
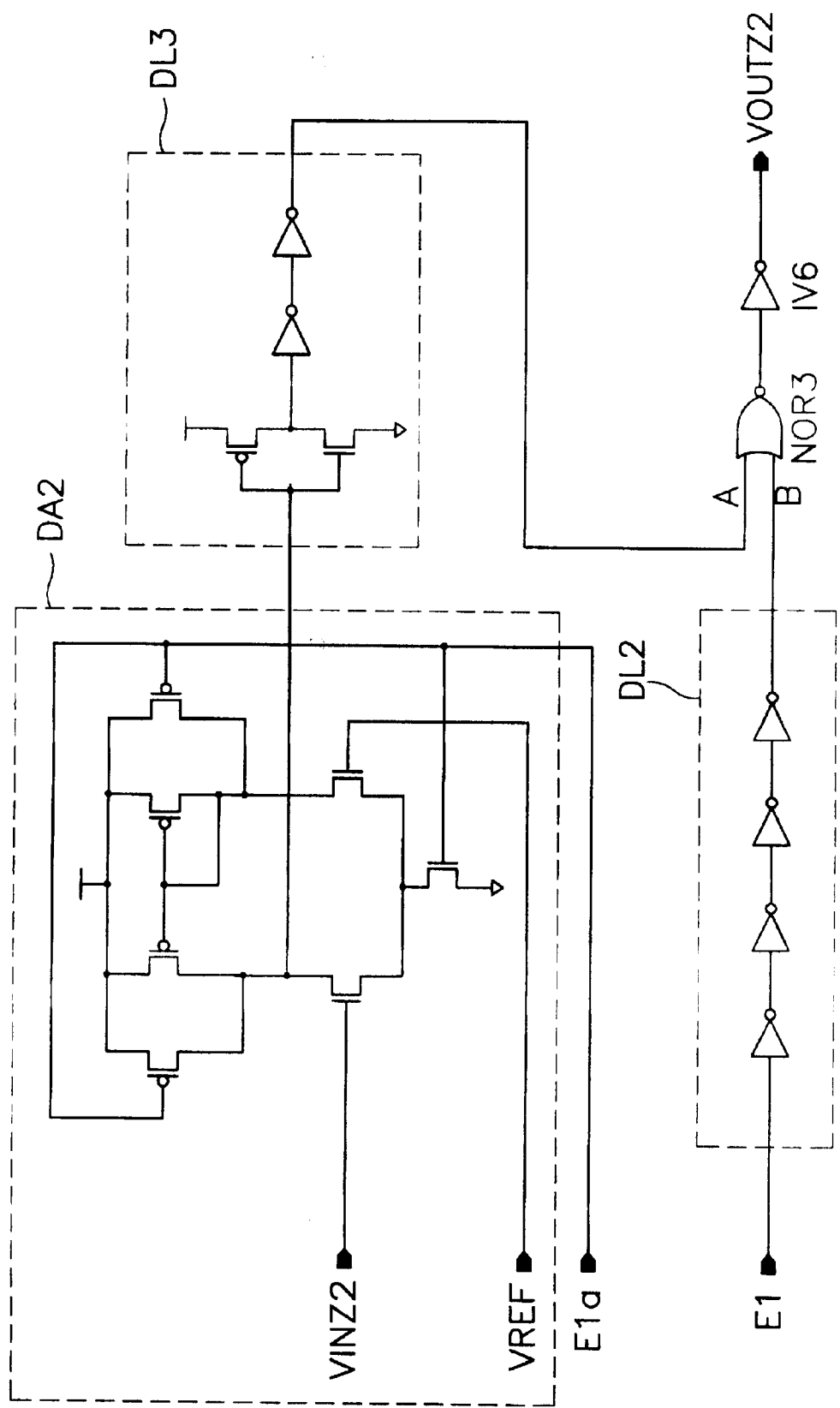
FIG. 3 is a circuit diagram of a chip selection signal buffer shown in FIG. 1.

Meanwhile, the CS buffer CSBUF is independently associated to the second buffer block 90, different from the WEBUF et al. The CS buffer CSBUF is constituted to be conductive in response to the first reverse signal E1a, with the same circuit architecture shown in FIG. 3.

The address buffers A1~An are formed to be conductive in response to the second reverse signal E1b and have the same constructions shown in FIG. 2.

With respect to an operation in the buffering circuit of FIG. 5, in the non-refresh mode, as the self-refresh signal SREF and the auto-refresh signal AREF are at low levels, the refresh signal REF sets a low level in the non-refresh mode. The clock enable signal CKE is applied to the NOR gate NOR5 through the clock enable latch 61 and the inverter IV7. The NOR gate NOR5 receives the reverse signal of the clock enable signal CKE and the refresh signal REF of low level, and then generates the first buffer enable signal E1 through the inverter IV8. As the refresh signal REF is at a low level, the first buffer enable signal E1 is exclusively dependent on a logic state of the clock enable signal CKE. An output signal of the inverter IV9 is at a high level because the auto-refresh signal AREF is held on a low level. The NAND gate ND1 receives the output signal of the inverter IV9, of a high level, for example, and the first buffer enable signal E1 responding to the clock enable signal CKE, and then generates the second buffer enable signal E2.

As a result, it can be seen that, in the non-refresh operation mode, since the first buffer enable signal E1 is substantially established on the clock enable signal CKE and the reverse of the first buffer enable signal E1 is the second buffer enable signal E2, the signal input buffers WEBUF, RASBUF, CASBUF, CSBUF, and A1~An are controlled by the clock enable signal CKE.

Otherwise, in the refresh mode, either the auto-refresh signal AREF or the self-refresh signal SREF goes up to a high level, so that the refresh signal REF is changed to a high level. The refresh signal REF of high level is applied to the NOR gate NOR5 in the first buffer controller 60, and thereby the first buffer enable signal E1 is forced to be a high level regardless of the logic state of the clock enable signal CKE. The first buffer enable signal E1 of a high level is applied to the NAND gate ND1 of the second buffer controller 70, and then the NAND gate ND1 generates the second buffer enable signal E2 of a high level in response to the reverse signal of the auto-refresh signal AREF of a high level regardless of the first buffer enable signal E1. Thus, the second buffer enable signal E2, during the refresh mode, is affected by the auto-refresh signal AREF. If the auto-refresh signal AREF is at a high or low level, the second buffer enable signal E2 is set on a low or high level.

The second buffer enable signals E1 and E2 are respectively applied to the first command buffer block 80 and the second command buffer block 90 in order to control activation of the buffers in their corresponding blocks.

In the self-refresh mode, the first command buffer block 80, the second command buffer block 90, and the address buffer block 40 are disabled. On the other hand, in the auto-refresh mode, the CS buffer CSBUF in the second command buffer block 90 and the address buffers A1~An in the block 40 are disabled while the buffers WEBUF, RASBUF, and CASBUF in the first command buffer block 80 are enabled.

Figure 4:
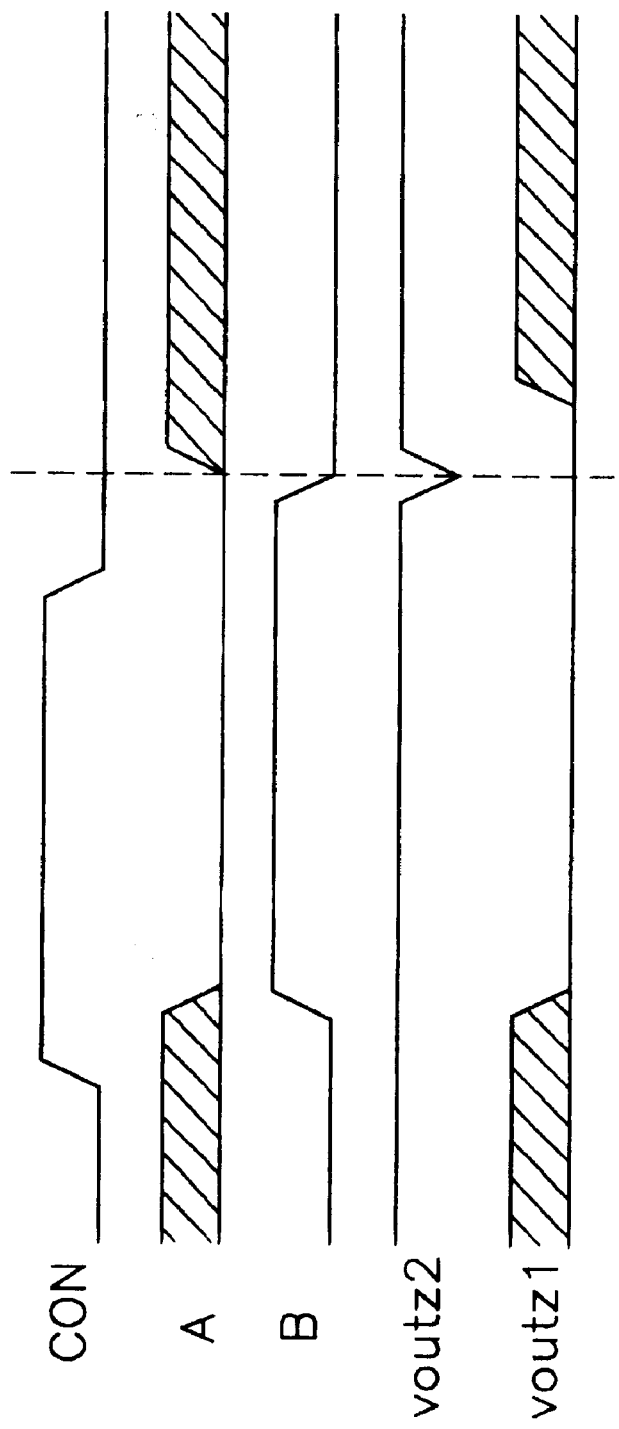
FIG. 4 is a timing diagram of the buffering circuit shown in FIG. 1, where there is a malfunction during an operation thereof.

The output signal VOUTZ2 (shown in FIG. 3) generated from the CS buffer CSBUF is buffered to be utilized as an internal command signal within the memory device. In order to prevent a unwanted entrance into the MRS state, the self-refresh mode can be free from the timing mismatch described above by means of regulating an activation time of an internal buffer treating VOUTZ2. And, the abnormal timing distortion as shown in FIG. 4 even in the auto-refresh mode, instead of the timing control with the internal buffer, can be overcome by activating the WE buffer WEBUF, the RAS buffer RASBUF, and the CAS buffer CASBUF using the first buffer enable signal E1 that is independent from the second buffer enable signal assigned to the CS buffer CSBUF, and by regulating an entrance of the input signal VINZ1 of the first command buffer shown in FIG. 2.

As described above, the invention offers an advantage of protecting a undesirable transition of an operation mode such as the MRS due to a timing distortion between command signals when the refresh mode is terminated, and of providing an easy manner to control activation of the buffers because the buffers are enabled with being divided into groups in accordance with their conduction styles.

Moreover, since the present buffering circuit employs a simple logic circuit to control activation of the buffers, the operation speed may enhance rather than using a physical delay in the condition of a high frequency operation and it is available to design the buffering circuit without burden of topological difficulties.

What is claimed is:

1. A buffering circuit of a semiconductor memory device, comprising:
    a first controller for generating a first enable signal by receiving a refresh signal and a clock enable signal;
    a second controller for generating a second enable signal by receiving an auto-refresh signal and the first enable signal;
    a first buffer block including at least one signal input buffer having an enable that is controlled by the first enable signal; and
    a second buffer block including at least one signal input buffer having an enable that is controlled by the second enable signal.

2. The buffering circuit according to claim 1, wherein the first controller is set to operate in a refresh mode or in a non-refresh mode in accordance with the refresh signal, and latches and outputs the clock enable signal in the non-refresh mode and outputting a first signal regardless of the clock enable signal in the refresh mode; and
    wherein the second controller is set to operate either in a non-auto refresh mode or in an auto refresh in accordance with the auto refresh signal, and outputs the first enable signal during non-automatic refresh mode operation and outputting the second enable signal regardless of the first enable signal during auto-refresh mode operation.

3. The buffering circuit according to claim 2, wherein the refresh signal is generated from a logic combination of a self-refresh signal and the auto refresh signal, and the first controller selects the refresh mode when a self-refresh mode and the auto-refresh mode are enabled, and the first and second buffer blocks are enabled with being controlled in accordance with the non-refresh mode, the auto-refresh mode, and the self-refresh mode.

4. The buffering circuit according to claim 3, wherein the first buffer block includes a chip selection buffer which is enabled in the non-refresh mode while disabled in the refresh mode; wherein the second buffer block includes a row address strobe buffer, a column address strobe buffer, and a write enable buffer, which is disabled in the non-refresh mode and the self-refresh mode while enabled in the auto-refresh mode.

5. The buffering circuit according to claim 4, wherein the chip selection buffer includes:
- a differential amplifier being enabled in response to a reverse signal of the first enable signal and amplifying an external chip selection signal;
- a first delay circuit for delaying an output signal of the differential amplifier;
- a second delay circuit for delaying the first enable signal; and
- a logical operator for combining output signals of the first and second delay circuits into a logical loop.

6. The buffering circuit according to claim 4, wherein each of the row address strobe signal buffer, the column address strobe signal buffer, and the write enable buffer includes:
- a differential amplifier for amplifying an external command signal; and
- a delay circuit for delaying an output signal from the differential amplifier.

7. The buffering circuit according to claim 4, wherein the first buffer block further includes address buffers.

8. The buffering circuit according to claim 2, wherein the first controller comprises a latch holding the clock enable signal, and a signal selector for selecting one of an output signal of the latch and a signal generated by logically combining a self-refresh signal and an auto-refresh signal.

9. The buffering circuit according to claim 8, wherein the signal selector is a logical operator for generating the first enable signal by logically combining the refresh signal and the output signal of the latch.

10. The buffering circuit according to claim 2, wherein the second controller includes a signal selector, for generating an alternative one of the first and second enable signals in accordance with the auto-refresh signal.

11. The buffering circuit according to claim 10, wherein the signal selector is a logical operator for generating the second enable signal by logically combining a reverse signal of the auto-refresh signal and the first enable signal.

* * * * *